United States Patent
Bayram et al.

(10) Patent No.: US 9,236,271 B2
(45) Date of Patent: Jan. 12, 2016

(54) LASER-INITIATED EXFOLIATION OF GROUP III-NITRIDE FILMS AND APPLICATIONS FOR LAYER TRANSFER AND PATTERNING

(71) Applicant: GLOBALFOUNDRIES INC., Grand Cayman (KY)

(72) Inventors: Can Bayram, Ossining, NY (US); Stephen W. Bedell, Wappingers Falls, NY (US); Devendra K. Sadana, Pleasantville, NY (US); Katherine L. Saenger, Ossining, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 246 days.

(21) Appl. No.: 13/749,330

(22) Filed: Jan. 24, 2013

(65) Prior Publication Data

US 2013/0280885 A1    Oct. 24, 2013

Related U.S. Application Data

(60) Provisional application No. 61/625,736, filed on Apr. 18, 2012.

(51) Int. Cl.
*H01L 21/30* (2006.01)
*H01L 21/46* (2006.01)
*H01L 21/428* (2006.01)
*H01L 21/18* (2006.01)
*H01L 33/00* (2010.01)
*H01L 21/683* (2006.01)

(52) U.S. Cl.
CPC ............. *H01L 21/428* (2013.01); *H01L 21/18* (2013.01); *H01L 21/185* (2013.01); *H01L 21/6835* (2013.01); *H01L 21/6836* (2013.01); *H01L 33/0079* (2013.01); *H01L 2221/68368* (2013.01); *H01L 2221/68381* (2013.01); *H01L 2221/68386* (2013.01)

(58) Field of Classification Search
None
See application file for complete search history.

(56) References Cited

U.S. PATENT DOCUMENTS

| | | | |
|---|---|---|---|
| 6,824,610 B2 * | 11/2004 | Shibata et al. | 117/89 |
| 7,384,807 B2 * | 6/2008 | Yoo | 438/29 |
| 8,313,968 B2 * | 11/2012 | Elgawadi | 438/46 |
| 2002/0175340 A1 * | 11/2002 | Shibata et al. | 257/103 |

(Continued)

OTHER PUBLICATIONS

Miskys, C.R., et al., "Freestanding GaN-substrates and devices", Physica Status Solidi, Sep. 2003, vol. 0, No. 6, pp. 1627-1650.

(Continued)

*Primary Examiner* — Calvin Choi
(74) *Attorney, Agent, or Firm* — Scully, Scott, Murphy & Presser, P.C.

(57) ABSTRACT

A pulsed laser-initiated exfoliation method for patterning a Group III-nitride film on a growth substrate is provided. This method includes providing a Group III-nitride film a growth substrate, wherein a growth substrate/Group III-nitride film interface is present between the Group III-nitride film and the growth substrate. Next, a laser is selected that provides radiation at a wavelength at which the Group III-nitride film is transparent and the growth substrate is absorbing. The interface is then irradiated with pulsed laser radiation from the Group III-nitride film side of the growth substrate/Group III-nitride film interface to exfoliate a region of the Group III-nitride from the growth substrate. A method for transfer a Group-III nitride film from a growth substrate to a handle substrate is also provided.

9 Claims, 8 Drawing Sheets

(56) References Cited

U.S. PATENT DOCUMENTS

| | | | |
|---|---|---|---|
| 2003/0015959 A1* | 1/2003 | Tomoda et al. | 313/498 |
| 2006/0105542 A1* | 5/2006 | Yoo | 438/455 |
| 2007/0108466 A1* | 5/2007 | Kryliouk et al. | 257/103 |
| 2008/0113460 A1* | 5/2008 | Shelton et al. | 438/28 |
| 2010/0172799 A1* | 7/2010 | Roeper et al. | 422/68.1 |
| 2011/0049541 A1* | 3/2011 | Katsuno et al. | 257/94 |
| 2011/0132549 A1* | 6/2011 | Sercel et al. | 156/712 |

OTHER PUBLICATIONS

Lesecq, M., et al., "High Performance of AlGaN/GaN HEMTs Reported on Adhesive Flexible Tape", IEEE Elect. Dev. Lett., Feb. 2011, vol. 32, No. 2, pp. 143-145.

Kim, H.-S., et al., "Unusual strategies for using indium gallium nitride grown on silicon (111) for solid-state lighting", Proc. Nat. Acad. Sci., Jun. 21, 2011, vol. 108, No. 25, pp. 10072-10077.

* cited by examiner

LASER-INITIATED EXFOLIATION OF GROUP III-NITRIDE FILMS AND APPLICATIONS FOR LAYER TRANSFER AND PATTERNING

RELATED APPLICATION

The present application claims benefit of U.S. Provisional Application No. 61/625,736, filed Apr. 18, 2012, the entire content of which is incorporated herein by reference.

TECHNICAL FIELD

The present disclosure relates to the transfer of a Group III-nitride-containing film from a growth substrate to a handle substrate. More particularly, the present disclosure relates to laser-initiated exfoliation methods for transferring a Group III-nitride-containing film from a Si growth substrate to a handle substrate. In addition, the present disclosure provides a laser-initiated exfoliation method for patterning Group III-nitride-based films on a growth substrate.

BACKGROUND

There is substantial interest in Group III-nitride materials and devices due to applications in optoelectronics, photovoltaics, and lighting. Group III-nitrides are composed of nitrogen (N) in combination with one or more elements from Group III of the Periodic Table of the Elements: i.e., boron (B), aluminum (Al), gallium (Ga), and/or indium (In). Some examples of Group III-nitrides include GaN, $Ga_xAl_{1-x}N$, $Ga_xIn_{1-x}N$, $Ga_xAl_yIn_{1-x-y}N$, MN, and $In_xGa_{1-x}N$, where $0 \le x \le 1.0$ and $0 \le y \le 1.0$. Light emitting diodes (LEDs) incorporating the semiconducting nitrides of Al, Ga, and In can be tuned to emit light over the entire visible range with appropriate choices of layer stack structure, composition, and doping, a fact that makes such materials very important to the solid state lighting industry.

For many applications, it is desirable to transfer Group III-nitride-based structures (e.g., Group III-nitride-based films and/or devices) from the substrate on which the Group III-nitride materials were grown to a handle or carrier substrate. Such transfer steps may be needed to allow additional layers (such as contacts and/or reflectors) to be formed on a bottom (substrate) side of the Group III-nitride film stack; to free an expensive growth substrate for reuse; or to provide a substrate that is more transparent and/or flexible than the growth substrate. Recently, there has been renewed interest in being able to transfer GaN-based films and/or GaN-based LED devices grown on Si to alternative carrier substrates.

Laser lift-off (LLO) is a well known technique for releasing GaN-based (and more generally, Group III-nitride-based) layers from sapphire growth substrates. In this process, pulsed UV laser radiation is directed through the transparent (non-absorbing) sapphire substrate to the sapphire/GaN interface. The GaN that is closest to the sapphire/GaN interface strongly absorbs the laser radiation, heats up, and decomposes into gaseous $N_2$ and a residual film of metallic Ga, producing a degradation in adhesion. As described by C. R. Miskys et al., "Freestanding GaN-substrates and devices," Physica Status Solidi C0 1627 (2003), this LLO technique may be applied over large (e.g., 50 mm diameter) areas to produce thick (approximately 300 μm thick), freestanding GaN layers. The above-described LLO process has also been used to produce thin (a few μm to 60 μm thick) GaN layers, in a configuration in which the GaN layer is bonded to a layer of material serving as a mechanical support prior to the laser irradiation.

The options are more limited for releasing GaN-based layers grown on Si, since LLO as described above is not suitable for detaching GaN-based films and/or devices from non-transparent growth substrates such as Si. Two main approaches have been used: In a first approach, a handle or carrier substrate is bonded to the top of a GaN layer stack, followed by Si substrate removal by grinding and etchback [see, for example, M. Lesecq et al., "High Performance of AlGaN/GaN HEMTs Reported on Adhesive Tape," IEEE Elect. Dev. Lett. 32 143 (2011)]. In a second approach, see, for example, Rogers, et al., "Unusual strategies for using indium gallium nitride grown on silicon (111) for solid-state lighting," Proc. Nat. Acad. Sci. 108 10072 (2011), the boundaries of tile-shaped InGaN regions to be transferred are defined by deep trenches that are etched through the InGaN and into the Si substrate. Using the trenches for access, the Si under the GaN tiles is then removed with a wet etch process that undercuts the Si with a fast lateral etch rate, allowing the tiles to be released and transferred as desired.

However, it would be useful to have simpler and less costly methods for transferring GaN-based films and devices from a Si growth substrate to alternative substrates or carriers.

There are also situations in which it would be useful to have an inexpensive and reliable method for patterning GaN-based structures disposed on Si substrates in order to create patterned GaN-based structures surrounded by relatively wide (e.g., 0.1 to 3 mm) border regions of bare Si. For these large feature sizes, resolution is not an issue; the main requirements for such a patterning process are good edge definition and minimal Si removal.

SUMMARY

In one aspect of the present disclosure, a pulsed laser-initiated exfoliation method for patterning a Group III-nitride film on a growth substrate is provided. This method includes providing a Group III-nitride film on a growth substrate, wherein a growth substrate/Group III-nitride film interface is present between the Group III-nitride film and the growth substrate. Next, a laser is selected that provides radiation at a wavelength at which the Group III-nitride film is transparent and the growth substrate is absorbing. The interface is then irradiated with pulsed laser radiation from the Group III-nitride film side of the growth substrate/Group III-nitride film interface to exfoliate a region of the Group III-nitride from the growth substrate.

In another aspect of the present disclosure, a laser-initiated exfoliation method for transferring a Group III-nitride-based film from a growth substrate to a handle substrate is provided. This method includes forming a Group III-nitride film on a growth substrate, the Group III-nitride film having a lower surface in contact with the growth substrate at a growth substrate/Group III-nitride film interface; bonding a handle substrate to an upper surface of the Group III-nitride film; selecting a laser providing pulsed laser radiation at a wavelength at which the Group III-nitride film and the handle substrate are non-absorbing, while the growth substrate is absorbing; irradiating the growth substrate/Group III-nitride film interface with the laser radiation, wherein the laser radiation (i) is incident from a handle substrate/Group III-nitride side, (ii) is provided in a pattern that defines the periphery of an area of the Group III-nitride film to be transferred, and (iii) causes the Group III-nitride film immediately adjacent to the irradiated areas to at least partially exfoliate away from the growth substrate while remaining bonded to the handle substrate; and removing a handle substrate/Group III-nitride film structure from the growth substrate.

DETAILED DESCRIPTION

The present disclosure, which provides a method for transferring a Group III-nitride-containing structure from a growth substrate to a handle substrate, and a method for patterning Group III-nitride-based films on a growth substrate, will now be described in greater detail in conjunction with the drawings that accompany the present application. It is noted that the drawings are provided for illustrative purposes only, and, as such, these drawings are not drawn to scale. It is also noted that throughout the drawings like elements/components are referred to by like reference numerals. It is further noted that in the drawings the arrows denote the direction of laser irradiation, which occurs from the Group III nitride film side of the structure, rather than from the growth substrate side of the structure.

In the following description, numerous specific details are set forth, such as particular structures, components, materials, dimensions, processing steps and techniques, in order to provide an understanding of some aspects of the present disclosure. However, it will be appreciated by one of ordinary skill in the art that the disclosure may be practiced without these specific details. In other instances, well-known structures or processing steps have not been described in detail in order to avoid obscuring the disclosure.

The present disclosure discloses how the phenomenon of laser-initiated exfoliation in an "inverted laser lift-off" geometry may be exploited for applications that include transferring one or more Group III-nitride-based layers or devices from a growth substrate to a handle or carrier substrate. The phenomenon is described herein as an exfoliation process because the bulk of the Group III-nitride removed is released from the growth substrate in flake-like pieces that retain the crystal structure of the original layer. The method of the present disclosure is described as an inverted laser lift-off process because the irradiation comes from the film side of the growth substrate/Group III-nitride interface rather than the growth substrate side of the interface (as is the case with LLO from sapphire/GaN samples).

To simplify the following description, the disclosure may be described for the specific case of GaN as the one or more Group III-nitride-based structures (or films) and a 111-oriented Si wafer as the growth substrate. However, it should be understood that the disclosure is also intended for use with a broad category of materials. The Group III-nitride based structures (or films) referred to as "GaN" may include Group III-nitride structures (or films) with multiple quantum wells (MQWs); any Group III-nitride, alone or in layered combinations with other Group III-nitrides, with or without doping; any of the aforementioned materials in combination with epitaxial layers of materials other than Group III-nitrides. The Si substrate may include Si with other surface orientations, Si with doping, and Si alloyed with C and/or Ge; III-V materials; as well as layers of any of these materials on insulator layers.

Throughout the present disclosure, the term Group III-nitride denotes a material that is composed of nitrogen (N) in combination with one or more elements from Group III of the Periodic Table of the Elements: i.e., boron (B), aluminum (Al), gallium (Ga), and/or indium (In). Some examples of Group III-nitrides that can be employed in the present disclosure include GaN, $Ga_xAl_{1-x}N$, $Ga_xIn_{1-x}N$, $Ga_xAl_yIn_{1-x-y}N$, AlN, and $In_xGa_{1-x}N$, where $0 \leq x \leq 1.0$ and $0 \leq y \leq 1.0$.

Throughout the present disclosure, the Group III-nitride film (or material) can be formed by metalorganic chemical vapor deposition (MOCVD) or molecular beam epitaxy (MBE). The MOCVD process includes introducing a Group III-containing precursor and a nitrogen-containing precursor into the reactor chamber of an MOCVD apparatus. In some embodiments, the Group III-containing precursor may be an organo-Group III containing compound, i.e., an organoaluminum compound, an organoindium compound, and/or an organogallium compound. In other embodiments, a Group III halide (typically a chloride) or hydride can be employed as the Group III-containing precursor. When an organo-Group III containing compound is employed, the Group III-containing precursor can be, for example, a trialkyl-Group III compound, wherein the alkyl contains from 1 to 6 carbon atoms. Examples of Group III compounds that can be employed in the present disclosure, include, but are not limited to, trimethylaluminum, triethylaluminum, tributylaluminum, trimethylgallium, triethylgallium, tributylgallium, trimethylindium, triethylindium, and/or tributylindium. Examples of nitrogen-containing precursors that can be used include, for example, ammonia ($NH_3$). In other embodiments the MOCVD and MBE processes may include introducing plasma-generated species (for example, N atoms generated from $N_2$ plasma) into the reaction chamber to allow improved growth at lower temperatures (e.g., below 850° C.).

An inert carrier gas may be present with one of the precursors used in forming the Group III-nitride, or an inert carrier gas can be present with both the precursors (i.e., Group III-containing precursor and a nitride precursor) used in forming the Group III-nitride. The deposition of the Group III-nitride is typically performed at a temperature of 850° C. or greater. In one embodiment, the deposition of the Group III-nitride typically occurs at a temperature from 900° C. to 1200° C. In another embodiment, the deposition of the Group III-nitride typically occurs at a temperature from 1200° C. to 1400° C. Notwithstanding the temperature in which the Group III-nitride is formed, the deposition of the Group III-nitride is performed for a time period of 1 minute to 2 hours. The Group III-nitride that is formed typically has a thickness from 100 nm to 5000 nm, with a thickness from 500 nm to 1000 nm being even more typical. Other thicknesses that are less than or greater than the above ranges can also be employed in the present disclosure.

In some embodiments, the Group III-nitride can be an intrinsic (i.e., undoped) Group III-nitride film. In other embodiments, the Group III-nitride can be an n-type Group III-nitride film. Yet in other embodiments, the Group III-nitride can be a p-type Group III-nitride film. In still other embodiments, a layered Group III-nitride structure including any combination of undoped and/or doped Group III-nitride films can be employed.

Throughout the present disclosure, the term "growth substrate" denotes a crystalline substrate on which the Group III-nitride is grown. The growth substrate is approximately latticed matched to the Group III-nitride film, to facilitate Group III-nitride film growth in epitaxial alignment with the substrate. Silicon with a 111 surface orientation is one preferred growth substrate.

The phenomenon of laser-initiated exfoliation can occur when high power pulsed laser radiation (at a wavelength at which GaN film is transparent and Si substrate is strongly absorbing) is applied to a spatially localized region of a Si/GaN interface from the GaN side of the interface. After passing through the GaN, the radiation is absorbed by the Si closest to the Si/GaN interface. Heat generated by this absorption diffuses into the overlying GaN, inducing a chemical decomposition of the GaN and the release of some gaseous nitrogen. A roughened region indicative of some mixing and/or reaction is also typically seen in the Si substrate at the center of the irradiated area. However, the Si laterally adjacent to the roughened regions is smooth and bare: the GaN originally situated there has cleanly separated from the Si substrate by exfoliation. Depending on the irradiation conditions and sample geometry, the released GaN can have a size distribution ranging from dust-sized (sub-micron) crystalline flakes to large (>millimeter) sheets.

Throughout the present disclosure, the pulsed laser radiation can be applied using any laser known system including for example, a laser scribing system having a stationary laser and a moving sample stage, with laser radiation provided by a diode-pumped Q-switched laser. The laser that is selected should provide radiation at a wavelength at which the Group III-nitride film (and, if present, the handle substrate) is transparent and the growth substrate is strongly absorbing. For example, a laser having a wavelength between 350 nm and 1064 nm can be used. At wavelengths shorter than 350 nm, the GaN starts to become absorbing; at wavelengths longer than 1064 nm, the Si may not absorb well. Wavelengths in the middle of this range (e.g., 532 nm) are preferred. However, it should be noted that Si absorption near the red (long wavelength) end of this range rapidly increases with Si temperature, an effect which typically produces a very efficient absorption due to the positive feedback between laser heating and absorption.

The pulsed laser radiation is preferably provided with a pulse length and a peak power sufficient to cause a localized vaporization without significant bulk substrate heating. Laser pulse lengths can range from 10 femtoseconds (fs) to 1 microsecond (µs), but are most typically in the 1 ns to 100 ns range. Exemplary laser pulses might be provided by a diode pumped Q-switched laser with wavelength/pulse lengths of 1064 nm/30 ns or 532 nm/20 ns (wherein it should be understood that the laser output at 532 nm would typically be the doubled output of a 1064 nm diode pumped Q-switched laser), focused to spot areas of ~30-50 µm diameter, repetition rates of 50-60 kHz, and average powers of 0.5-5 W.

The dimensions and locations of the exfoliated regions may be controlled by applying the laser radiation in a pattern. A pattern of laser radiation may be applied to a sample with a fixed-position laser beam and a moving sample, with a moving laser beam applied to a fixed-position sample, or with some combination of the two.

In a first embodiment of the disclosure, a laser-initiated exfoliation method is provided for patterning GaN on Si. Exfoliative patterning of GaN is expected to be particularly useful for cases in which good GaN edge definition and minimal Si removal are critical, yet exact control over feature dimensions is not (since the exact dimensions of the exfoliation can be hard to control). In such cases, GaN patterning by laser-initiated exfoliation may be preferable to conventional etching (i.e., reactive ion etching and/or wet etching) because the laser process is maskless, fast (particularly when only small areas are to be removed), and inexpensive. In a variation of this embodiment, the patterning process is performed in the presence of blanket or patterned sacrificial layers that protect the Si/GaN workpiece from redeposition of GaN particulates.

In a second embodiment of the disclosure, a laser-initiated exfoliation method is provided for transferring GaN-based structures from a Si growth substrate to a tape or handle substrate. In this method, a non-absorbing, tape or support layer is bonded to the GaN surface of the Si/GaN. The Si/GaN interface is irradiated through the tape in localized regions (the localized regions typically forming a grid pattern of intersecting lines or "streets") to define the boundaries of the GaN areas or "tiles" to be transferred. The irradiation causes GaN in the vicinity of the irradiated regions to exfoliate (or at least partially exfoliate) onto the tape. After laser processing, the tape/GaN layer is peeled from the substrate. The term "at least partially exfoliated" is used to highlight the fact the forces responsible for separating the GaN from the Si substrate include the forces of laser exfoliation as well as the forces introduced by the tape peeling steps occurring after laser irradiation. For relatively high fluence irradiation conditions, in which GaN exfoliation in the vicinity of a first irradiated region spontaneously typically extends into the vicinity of an adjacent irradiated region, tape peeling forces play only a minor role. However, for the lower fluence conditions that are more typical, the exfoliated GaN regions remain localized to the irradiated areas at the tile boundaries and the adjacent delamination regions remain unconnected. For these cases, full release and tape transfer of the GaN tiles are accomplished in conjunction with a tape peeling that extends the initial areas of delamination to the entirety of the GaN area within the tile boundaries.

It is noted that this second embodiment differs in two significant ways from prior art LLO processes for sapphire/GaN. First, the present LLO process is inverted, with laser irradiation is from the film side rather than the substrate side. Second, the laser irradiation in the present method is only needed at the periphery of the transferred region (vs. over the entire area of the transferred region).

Many variations of the transfer method of the present disclosure are contemplated. In one embodiment, the tape substrate may be a pressure-sensitive tape selected for permanency or selected for easy release (e.g., UV-release tape), a solution-deposited polymeric film, and/or a combination thereof. In another embodiment, one or more absorbing layers may be included between the GaN-based structures and the Si substrate. In yet another embodiment, one or more transparent interposer layers (blanket and/or patterned) may be included between the GaN-based structures and the tape (e.g., for improved mechanical strength). In a further embodiment, the GaN-based structures on the substrate may be blanket, patterned (with openings or depressions; in the case of openings, the separation regions may be filled or empty, and may further include filled or empty trenches extending into the substrate). In an even further embodiment, the GaN-based structure may comprise GaN-based layers with one or more patterned layer features such as contacts on or embedded in the GaN-based layers, where these patterned features would typically and preferably be either transparent or outside any regions irradiated with the laser.

In a third embodiment (similar to the second embodiment, but more directed to devices), the above-described laser-initiated exfoliation methods are applied to the transfer of GaN-based structures comprising fully or partially completed GaN-based devices such as LEDs, field effect transistors (FETs), and high electron mobility transistors (HEMTs). The LED device aspect of this disclosure is anticipated to be particularly useful. GaN-based LEDs typically include a planar layer stack with a lower layer of one doping type (n-type or p-type) and an upper layer of the opposite doping type (p-type or n-type), along with spaced-apart n-type contacts to the n-type layer and p-type contacts to the p-type layer. These contacts may be on the same side of the GaN-based layer structure or on opposite sides of the GaN-based layer structure.

Transfer of the GaN-based layer structure may be performed in several modes. For example, both n-type and p-type contacts can be formed on the top side of GaN-based layers while the GaN-based layers are still situated on the Si substrate, before the tape transfer process (where it is understood that one set of contacts is deposited only after a recess etch to remove a surface region of GaN, and that one set of contacts may have a two-tone transparency). In another embodiment, one type of the n-type and p-type contacts is formed before the transfer process and the other type is formed after the transfer process. In yet another embodiment, both n-type and p-type contacts are formed after the transfer process.

After transfer to the tape substrate and completion of any desired processing that is to be done while the GaN-based structures are still on the tape, the GaN-based structures may remain on the tape as-is or be transferred to yet another substrate for further processing or final packaging.

Finally, a fourth embodiment of the disclosure provides GaN-based structures and devices (such as LEDs) fabricated using the laser-initiated exfoliation methods of this disclosure.

The various embodiments which were briefly described above are now described in greater detail.

As stated above, a pulsed laser-initiated exfoliation method for patterning a Group III-nitride-based film stack on a growth substrate is provided. This first embodiment of the present disclosure includes providing a Group III-nitride film, e.g., GaN, on a growth substrate (e.g., 111 Si), wherein a growth substrate/Group III-nitride film interface is present between the Group III-nitride film and the growth substrate. Next, a laser is selected that provides radiation at a wavelength at which the Group III-nitride film is transparent and the growth substrate is absorbing. The interface is then irradiated with pulsed laser radiation from the Group III-nitride film side of the growth substrate/Group III-nitride film interface to exfoliate a region of the Group III-nitride from the growth substrate.

Figure 1A:
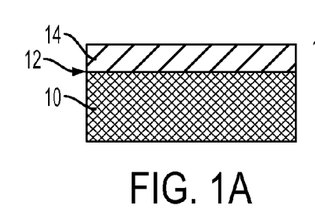
FIGS. 1A-1B show cross section view schematics of a structure including a Si substrate and a Group III-nitride film before (FIG. 1A) and after (FIG. 1B) line patterning by the laser-initiated exfoliation method of the present disclosure.
Figure 1B:
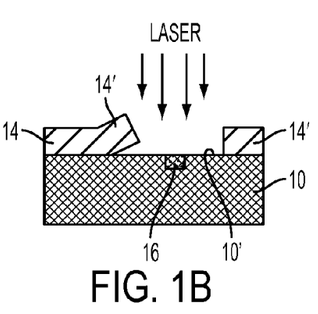

The above mentioned patterning method of the present disclosure is shown in FIGS. 1A-1B. Specifically, FIGS. 1A-1B show cross section view schematics of a Si/Group III-nitride-stack before (FIG. 1A) and after (FIG. 1B) line patterning by the laser-initiated exfoliation process of the present disclosure, and FIG. 1C shows a plan view schematic of the structure of FIG. 1B.

In particular, FIG. 1A shows an initial structure including a Si substrate 10 (as a growth substrate) and a Group III-nitride film 14 located on an uppermost surface of the Si substrate 10. A substrate/Group III-nitride interface 12 is present between the Si substrate 10 and the Group III-nitride film 14. At this point of the present disclosure, the Group III-nitride film 14 is a contiguous film that spans the entirety of the upper surface of the Si substrate 10.

Figure 1C:
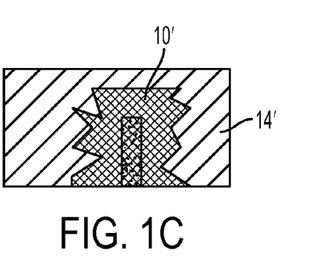
FIG. 1C shows a plan view schematic of the structure of FIG. 1B.

The structures of FIGS. 1B and 1C, illustrate the structure of FIG. 1A after line patterning by the laser-initiated exfoliation method of the present disclosure. In these drawings, reference numeral 14' denotes Group III-nitride film portions remaining on or at the growth substrate in the neighborhood of the irradiation, and reference numeral 14 denotes undisturbed Group III-nitride film portions on the substrate far from the irradiation. Reference numeral 16 denotes a roughened reaction/mixing zone that is formed into the Si substrate 10. The term "roughened reaction/mixing zone" as used throughout the present disclosure denotes a rough region of indeterminate composition and microstructure, but rich in the Group III metal and Si substrate and possibly including the elements N, O, and C. The roughened reaction/mixing zone 16 is formed at a portion of the original substrate/Group III-nitride interface 12. Reference numeral 10' denotes an exposed portion of the substrate 10.

In a variation of the above patterning process, the patterning process can be performed in the presence of a blanket or patterned sacrificial protection layer that protects the work piece from redeposition of Group III-nitride, i.e., GaN particulates. In this variation, the basic method would further including the steps of forming a sacrificial protection layer on the surface of the Group III-nitride film prior to laser irradiation. In some embodiments, the sacrificial protection layer is disposed at least over Group III-nitride areas not being irradiated and functioning to protect the non-irradiated Group III-nitride areas from redeposition of laser-generated particulates. In another embodiment, the sacrificial protection layer may consist of a contiguous, i.e., blanket layer, atop the entirety of the Group III-nitride film. The effect of the laser radiation on the blanket sacrificial layer will depend on the absorption characteristics of the sacrificial layer. If the sacrificial layer is absorbing, the laser irradiation would typically induce a localized removal of both the sacrificial protection layer and the GaN from the irradiated area. If the sacrificial layer is non-absorbing, the sacrificial layer in the irradiated region would typically remain intact. After patterning the Group III-nitride film, the remaining portions of the sacrificial protection layer can be removed from the structure utilizing techniques well known those skilled in the art.

Figure 1D:
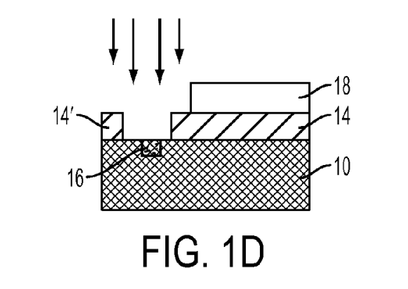
FIGS. 1D-1E show variations of this patterning process in cross section view.
Figure 1E:
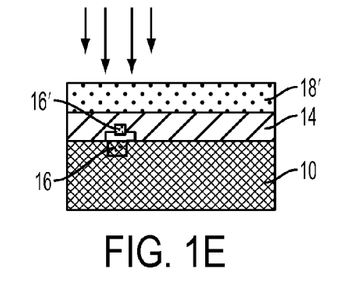

Reference is now made to FIG. 1D, which illustrates how the patterning method of FIGS. 1A-1C may be implemented with a patterned sacrificial layer 18 and FIG. 1E shows how the patterning method of FIGS. 1A-1C may be implemented with a blanket sacrificial protect layer 18'. An example of a patterned sacrificial layer 18 that can be used in the present disclosure includes a photoresist. An example of a blanket sacrificial layer 18' that can be used in the present disclosure includes a transparent tape such as a UV-release tape. After laser patterning, removal of the photoresist layer may be accomplished by dissolving it in a solvent such as acetone and removal of the UV-release tape may be accomplished by peeling (with or without first exposing it to a UV light source).

Example 1

Figure 1F:
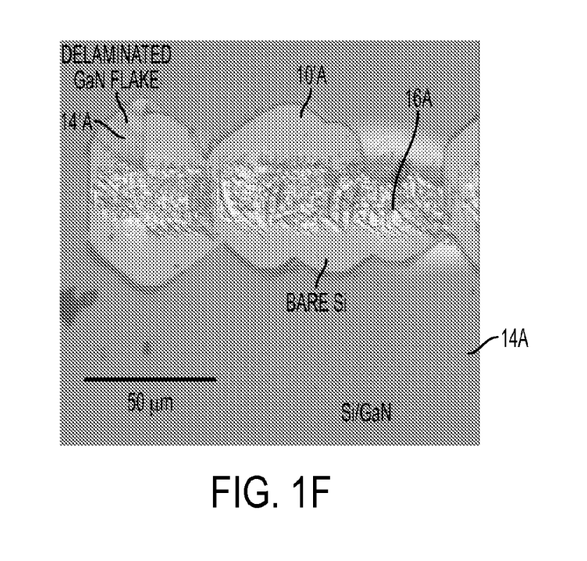
FIG. 1F shows a plan view optical micrograph of an Si/Group III-nitride stack after patterning according to the schematics of FIGS. 1A-1C.

FIG. 1F shows a plan view optical micrograph of a Si/III-nitride structure after patterning according to the schematic of FIGS. 1A-1C. The Si/III-nitride structure was comprised of a GaN-based layer, approximately 3.0 µm in thickness, deposited on 111-oriented Si by metalorganic chemical vapor deposition (MOCVD). More specifically, the GaN-based layer comprised (from bottom to top) AlN(120 nm)/AlGaN(650 nm, graded buffer)/undoped-GaN(400 nm)/undoped GaN(600 nm, with 1e16/cm$^3$ C) AlN(8 nm)/undoped GaN (1500 nm, with 1e16/cm$^3$ C)/undoped GaN(400 nm)/AlN(1 nm)/AlGaN(26 nm)/GaN(2 nm). Here, as in the rest of the examples, the pulsed laser irradiation was applied in a localized pattern using an OpTek laser scribing system having a stationary laser and a moving sample stage, with laser radiation provided by a diode-pumped Q-switched laser with output at 532 or 1064 nm in 20-30 ns pulses in a Gaussian intensity distribution. For this example, the laser had a wavelength of 532 nm, a repetition rate of 60 kHz, and an average power of about 0.93 W, corresponding to a pulse energy of 16 µJ and, for an assumed beam diameter of 30 µm, fluences of approximately 2.3 J/cm$^2$ and a peak power density of $1\times10^8$ W/cm$^2$. For the 100 mm/sec scan rate used, each position along the irradiated line was exposed to about 20 laser pulses (=beam size*repetition rate/scan rate). It is noted that reasonably similar results were achieved with 1064 nm pulses having a 30 ns pulse width, 60 kHz repetition rate, and an average power of 8 to 11 W. Variations within a factor of two or so of the values mentioned for beam diameter, fluence, pulse energy, scan speed, etc. can work as well; these values are meant to be exemplary rather than limiting.

Several features may be identified in the image of FIG. 1F: a roughened mixing and/or reaction zone overlapping with the center of the laser irradiation (marked as 16A); pristine-looking bare Si regions extending out many micrometers from the mixing zone (marked as 10'A), from which the GaN has exfoliated; and undisturbed Si/GaN substrate regions far from the laser irradiation (marked as 14A). In addition, one may see a flake of exfoliated GaN still attached to the substrate (marked as 14'A).

As also stated above, a laser-initiated exfoliation method for transferring a Group III-nitride film from a growth substrate to a handle substrate is provided. This second embodiment of the present disclosure includes forming a Group III-nitride film on a growth substrate, the Group III-nitride film having a lower surface in contact with the growth substrate at a growth substrate/Group III-nitride film interface; bonding a handle substrate to an upper surface of the Group III-nitride film; selecting a laser providing pulsed laser radiation at a wavelength at which the Group III-nitride film and the handle substrate are non-absorbing, while the growth substrate is absorbing; irradiating the growth substrate/Group III-nitride film interface with the laser radiation, wherein the laser radiation (i) is incident from a handle substrate/Group III-nitride side, (ii) is provided in a pattern that defines the periphery of an area of the Group III-nitride film to be transferred, and (iii) causes the Group III-nitride film immediately adjacent to the irradiated areas to at least partially exfoliate onto the handle substrate; and removing a handle substrate/Group III-nitride film structure from the growth substrate.

Figure 2A:
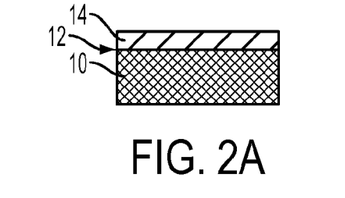
FIGS. 2A-2D show a simplified cross section schematic of a laser-initiated exfoliation method of the present disclosure for transferring a Group III-nitride-based structure from a Si growth substrate to a handle substrate.
Figure 2B:
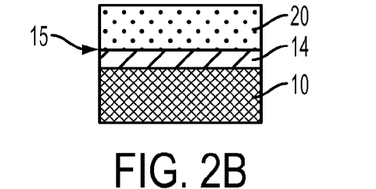
Figure 2C:
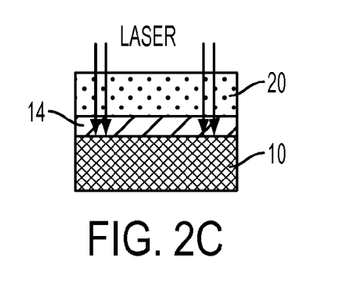
Figure 2D:
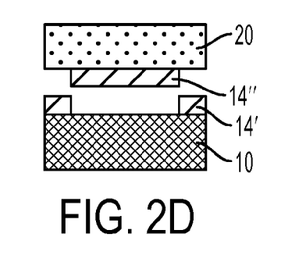
Figure 2E:
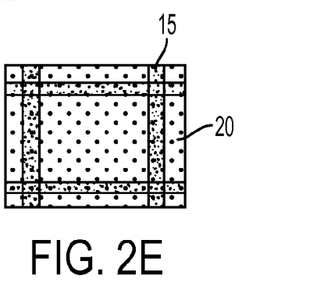
FIG. 2E shows a top view of the structure of FIG. 2C for the case of a grid pattern of irradiation.

Referrence is now made to FIGS. 2A-2D which show a simplified cross section schematic of a laser-initiated exfoliation method of the present disclosure for transferring a Group III-nitride film, e.g., GaN, from a growth substrate, e.g., 111 Si, to a handle substrate, e.g., tape, and FIG. 2E shows a top view of the structure of FIG. 2C for the case of irradiation in a grid pattern 15.

Specifically FIG. 2A shows an initial structure which includes Si substrate 10 (as the growth substrate) and a Group III-nitride film 14 on the Si substrate 10. As shown, a Si substrate/Group III-nitride film interface 12 is present between the Si substrate 10 and the Group III-nitride film 14. FIG. 2B shows the structure of FIG. 2A after forming a handle substrate 20 on surface 15 of the Group III-nitride film 14. The handle substrate 20 is preferably flexible and is non-absorbing at the wavelength of irradiation. The handle substrate 20 might be a pressure sensitive tape comprising an upper backing layer and a lower adhesive layer, or, more generally, a freestanding film that is bonded to the Group III-nitride layer with an adhesive. Alternatively, the handle substrate 20 might be a deposited transparent layer formed by methods such as solution-deposition (e.g., spin casting), chemical vapor deposition, or plasma-enhanced chemical vapor deposition. One example of a handle substrate 20 that can be employed in the present disclosure is a tape. In embodiments in which the handle substrate 20 is a tape, the tape may be a pressure-sensitive tape selected for permanency or selected for easy release (e.g., UV-release tape), a solution-deposited polymeric film, and/or combinations thereof. Solution-deposited polymeric films might include PMMA [Poly(methyl methacrylate)] and elastomers such as crosslinked PDMS [polydimethylsiloxane]. The tape should be relatively non-absorbing at the laser wavelength, but it does not have to be perfectly transparent. The UV-release tape used for Example 2 below, while not absorbing at the laser wavelength, was not perfectly transparent due to refractive index inhomogeneities within the tape. This translucence may contribute to a beneficial laser beam homogenization within the irradiated region.

FIG. 2C shows the structure of FIG. 2B during laser irradiation which occurs from the handle substrate 20/Group III-nitride film 14 side of the structure, i.e., in a downward direction relative to the structure shown in FIG. 2B, rather than from the growth substrate/Group III nitride film side of the structure, i.e., upward from the backside of the structure shown in FIG. 2B. FIG. 2D shows the structure after removing the handle substrate 20 from the structure. As shown, a Group III-nitride film portion 14" remains attached to the handle substrate 20. Elements 14" and 20 may be referred to herein as a handle substrate/Group III-nitride film structure. In one embodiment of the present disclosure and when a tape is employed as the handle substrate 20, the structure including the handle substrate 20 and the Group III-nitride film portion 14" can be removed from the growth substrate by peeling.

Many phenomena can occur during irradiation of growth substrate/Group III-nitride interfaces. The exact results of the laser heating will depend on the laser conditions (e.g., wavelength, fluence, etc.) and sample geometry (e.g., bare Si/GaN or Si/GaN with a transparent tape overlayer). In addition to GaN exfoliation (which can include GaN exfoliation in macroscopic sheets, GaN explosive exfoliation into GaN debris, formation of intact or broken GaN blisters), one may also see one or more of the following: Si/GaN vaporization with deep Si etching, Si vaporization, Si melting, Si/Ga/GaN intermixing/reaction, and GaN decomposition. In addition to nitrogen gas release from the GaN (or III-nitride) stack, and thermal shock, thermal expansion mismatch, and intrinsic interface stress may play a role in the GaN exfoliation and interface fracture.

Figure 3:
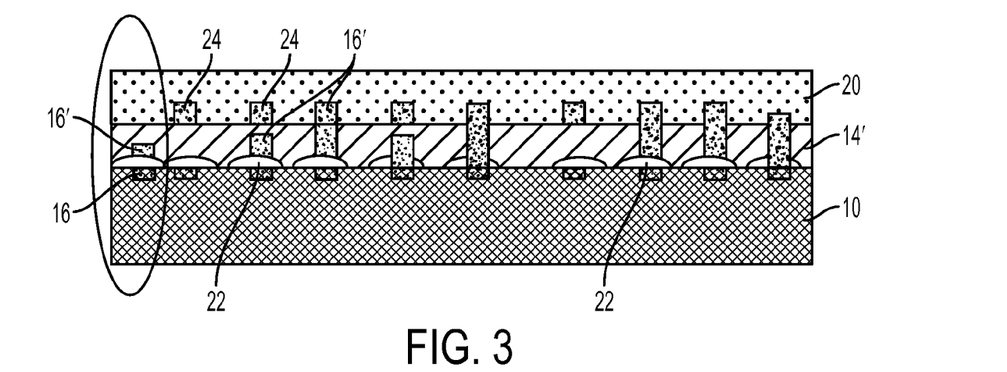
FIG. 3 shows simplified cross section view schematics of ten possible damage/delamination scenarios that may result from laser irradiation of a Si/Group III-nitride film/tape structure.

FIG. 3 shows simplified cross section view schematics of ten possible damage/delamination scenarios that may result from laser irradiation of Si substrate 10/Group III-nitride film 14/handle substrate 20 structure. Roughened intermixing/reaction zones may be formed on one or both sides of the Si substrate 10/Group III-nitride film 14 interface, where 16 denotes a reaction zone on the Si substrate side and 16' denotes a reaction zone on the handle substrate side. Depending on laser fluence, the roughened regions in the Group III-nitride film 14 can terminate within the Group III-nitride film 14, or extend all the way up to the handle substrate 20. At high fluence conditions, there may be a mild pyrolysis of the handle substrate 20 due to heat transfer from the irradiated Si substrate 10/Group III-nitride film 14 interface. The conditions used in Example 2 below appear to result in the damage/delamination scenario marked with a circle (no pyrolysis of handle substrate 20 and relatively shallow roughened intermixing/reaction zones 16 and 16'). In FIG. 3, reference numeral 22 denotes a void that is formed by exfoliation, while reference numeral 24 denotes a pyrolized handle substrate 20.

Figure 4A:
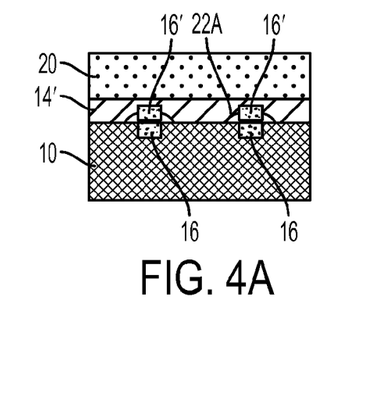
FIGS. 4A-4B show cross section view schematics of possible delamination scenarios: a localized exfoliation/delamination (FIG. 4A), and an extended area exfoliation/delamination (FIG. 4B).
Figure 4B:
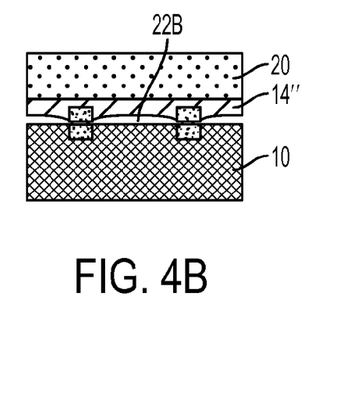

FIGS. 4A-4B show cross section view schematics of two possible delamination scenarios: a localized exfoliation/delamination scenario (FIG. 4A) and an extended area exfoliation/delamination scenario (FIG. 4B). In the localized exfoliation/delamination scenario of FIG. 4A, voids 22A remain confined to the edges of the irradiated area. This scenario is typically seen with a lower fluence laser irradiation and/or more adherent Group III-nitride films, and is more likely when adjacent irradiated areas are far apart. In the extended area exfoliation/delamination scenario of FIG. 4B, voids originating at the irradiated area merge to form an extended area void 22B. This scenario is typically seen with a higher fluence laser irradiation and/or less adherent Group III-nitride films, and is more likely when adjacent irradiated areas are more closely spaced. For the case of laser wavelength 532 nm, 20 ns pulse length, spot size of 30-40 µm, 60 kHz repetition rate, and scan rate of 100 mm/s, the threshold power for transition between these two scenarios is about 1 W. For the localized void scenario of FIG. 4A, handle substrate 20 peeling is needed to complete the exfoliation; for the extended void scenario of FIG. 4B, the handle substrate 20 functions primarily as a support.

Example 2

FIGS. 5A, 5B, 6A, 6B and 6C show plan view optical micrographs of a Si/Group III-nitride/UV-release tape sample at different stages during the transfer method of the present disclosure. The Si/Group III-nitride sample was nominally identical to the structure described in Example 1, as were the laser conditions. Laser radiation was applied in an orthogonal line pattern 40 to form a 300 µm (FIGS. 5A-5D) or 200 µm (FIGS. 6A, 6B and 6C) grid.

Figure 5A:
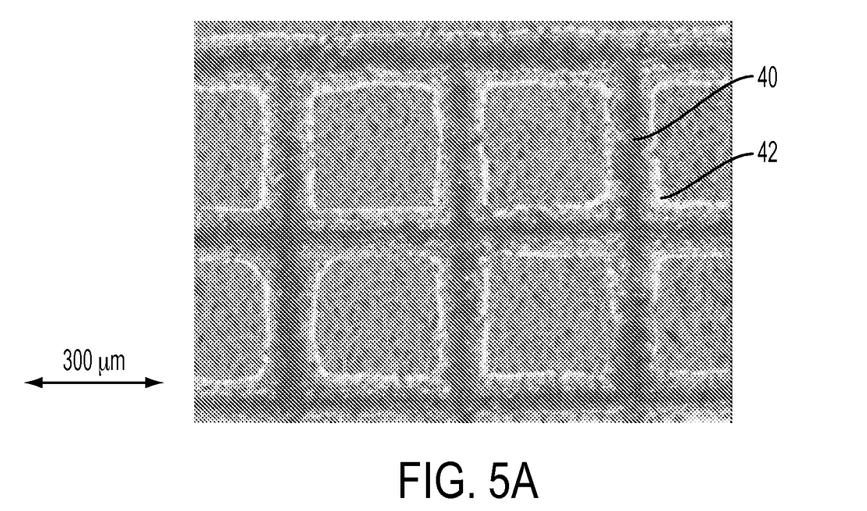
FIGS. 5A-5B show plan view optical micrographs of a Si/Group III-nitride film/UV-release tape sample under conditions corresponding to the schematics of FIGS. 5A and 5B.
Figure 5B:
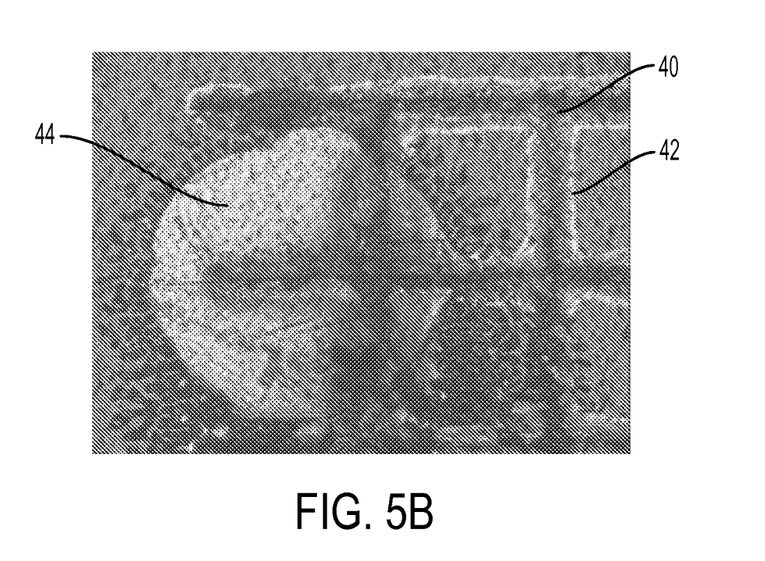

Both images of FIG. 5 are through the tape. Buried reaction/mixing zones (not marked in FIG. 5, but shown as 16 and 16' in FIG. 4 and FIGS. 6B and 6C) are visible below the line pattern in the tape. It can be seen that the laser-initiated exfoliation can be localized (with voids 42 analogous to localized voids 22A in FIG. 4A), as shown in FIG. 5A, or a combination of localized (with voids 42) and non-localized (with void 44, analogous to non-localized void 22B in FIG. 4B), as shown in FIG. 5B.

Figure 6A:
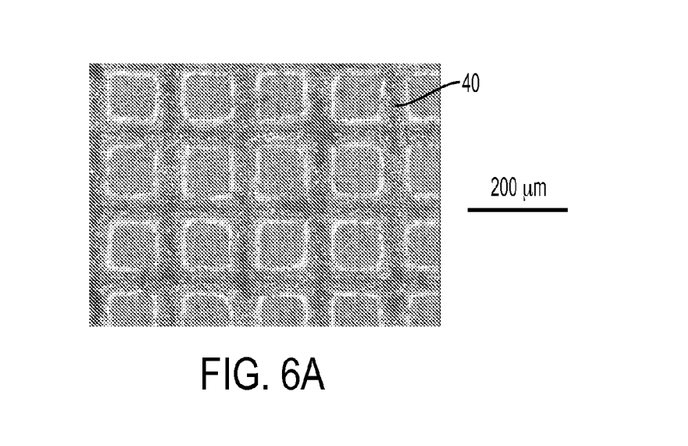
FIGS. 6A-6C show plan view optical micrographs of a Si/Group III-nitride film/UV-release tape sample at different stages during the transfer method of the present disclosure: the sample with the tape still on, after laser irradiation in a grid pattern (FIG. 6A); the Si/Group III-nitride film sample of FIG. 6A after the tape has been peeled (FIG. 6B); and the tape with the removed Group III-nitride (Group III-nitride side up) after peeling (FIG. 6C).
Figure 6B:
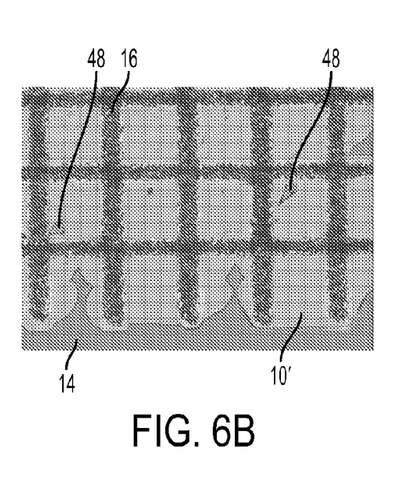
Figure 6C:
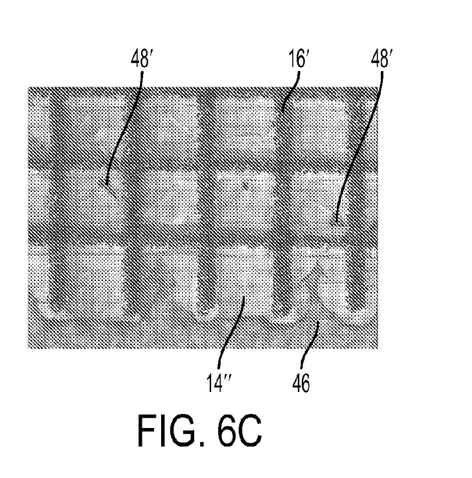

FIGS. 6A-6C show plan view optical micrographs of the Si/GaN/UV-release tape sample at different stages during the transfer method of the present disclosure. FIG. 6A shows the sample with tape still on, after laser irradiation in (200 µm) grid pattern 40 (FIG. 6A). FIG. 6B shows the Si/GaN sample of FIG. 6A after the tape has been peeled (FIG. 6B) and FIG. 6C shows the tape/GaN sample (GaN side up) after peeling. Reference numerals 10 and 14 in FIG. 6B indicate, respectively, the exposed Si growth substrate and GaN on the growth substrate. Reference numerals 46 and 14" in FIG. 6C indicate, respectively, exposed tape regions and transferred GaN reaction/mixing zones at the grid line positions appear to be present on both the growth side and the handle side of the peel (16 and 16', respectively). It can be seen that small regions of GaN 48 remaining on the Si growth substrate side of the peel (FIG. 6B) correspond to small gaps 48' in the transferred GaN layer on the tape side of the peel (FIG. 6C).

While Example 2 was described for the case of laser conditions similar to those used for Example 1 (532 nm laser wavelength, approximately 16 µJ pulse energy, 30-40 µm diameter spot, 60 kHz repetition rate, and a 100 mm/sec scan rate), the conditions described here for Example 2 are meant to be exemplary rather than limiting. Exfoliation may be initiated with a substantially wider range of laser conditions and scanning rates. For the focus conditions used (sample offset 0.7 mm from the focal point), pulse energies in the range of 5 to 60 µJ are expected to provide a useful exfoliation. It should be noted that the non-localized exfoliation illustrated in FIG. 4B could be reliably produced in Si/GaN/tape samples with approximately 30 µJ pulse energies. However, care must be taken when using these higher fluences with small grid spacings, since the gas released from the irradiated regions can coalesce to produce large bubbles and a premature peel of the tape at the GaN/tape interface in sample areas not yet irradiated.

The transfer method of the present disclosure may be implemented with many variations. For example, one or more optically absorbing epitaxial interlayers may be included between the Group III-nitride film 14 and the Si substrate 10. Such interlayers might have higher absorption coefficients than the Si growth substrate (leading to a stronger and more depth-localized absorption) or provide a diffusion barrier function to prevent intermixing between atoms of the Group III-nitride film 14 and the Si substrate 10. $In_zGa_{1-z}N$ with $0.3 \leq z \leq 0.5$ is one example of an absorbing interlayer.

In another variation, this transfer method may be implemented with one or more transparent interposer layers (blanket and/or patterned) included between the Group III-nitride film 14 and the handle substrate 20, e.g., tape, with the deposited layer providing additional mechanical support, crack reducer and being transparent enough not to interfere with the irradiation process. Illustrative examples of interposer layers that can be employed in the present disclosure include, but are not limited to, $SiO_2$, SiN, and/or AlOx layers deposited by plasma-enhanced chemical vapor deposition.

Figure 7A:
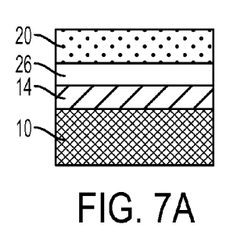
FIGS. 7A-7C show, in cross section view, how the laser-initiated exfoliation method of FIG. 2 may be implemented with an interposer layer disposed on a Group III-nitride-based structure.
Figure 7B:
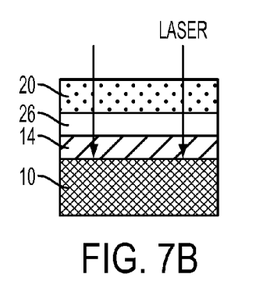
Figure 7C:
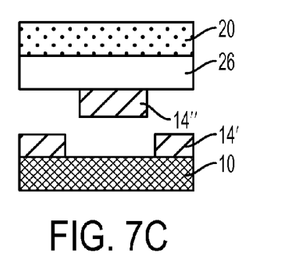

Reference is made to FIGS. 7A-7C which illustrate the transfer method of the present disclosure in which an interposer layer 26 is disposed between the handle substrate 20 and the Group III-nitride film 14. Specifically, FIG. 7A illustrates an initial structure that can be used in one embodiment which includes, from bottom to top, a Si substrate 10, a Group III-nitride film 14, an interposer layer 26 and a handle substrate 20. FIG. 7B illustrates the structure of FIG. 7A during laser irradiation, while FIG. 7C illustrates the structure after transferring.

Figure 8A:
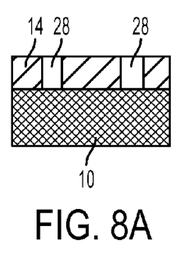
FIGS. 8A-8E show, in cross section view, examples of feature-containing Group III-nitride-based structures that might be transferred with the laser-initiated exfoliation method of FIG. 2, and FIGS. 8F-8G show, in cross section view, how patterns of laser irradiation may be aligned to overlap with (FIG. 8F) or be offset from (FIG. 8G) these features.
Figure 8B:
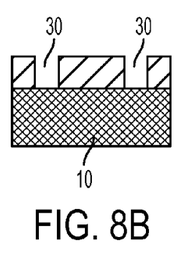
Figure 8C:
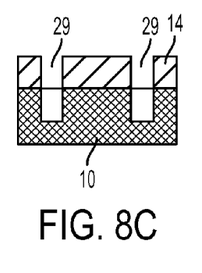
Figure 8D:
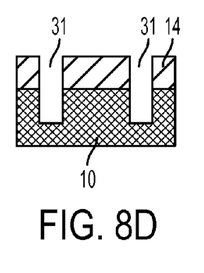

While the disclosure has so far been illustrated for the case of blanket Group III-nitride film 14, the Group III-nitride films 14 on the growth substrate (i.e., Si substrate 10) may also be patterned, for example, with openings or trenches or depressions for singulation. In the case of openings, the opening may be filled openings 28 (FIG. 8A) or empty openings 30 (FIG. 8B), and may further include filled trenches 29 (FIG. 8C) or empty trenches 31 (FIG. 8D) extending into the Si substrate 10. Empty openings or trenches can be formed into the Group III-nitride film 14 utilizing the patterning process mentioned above. An etch can be used transfer the opening in the patterned Group III-nitride film 14 to the underlying Si substrate 10. The openings/trenches can remain unfilled, or they can be filled with a dielectric material such as, for example, $SiO_2$, silicon nitride, and/or silicon oxynitride utilizing a conventional deposition process including, but not limited to, chemical vapor deposition, and plasma enhanced chemical vapor deposition. In some embodiments, an epitixial growth can be used to fill the openings/trenches. A planarization process may follow the filling of the opening/trenches. The empty and filled openings/trenches may provide a separation region within the Group III-nitride film 14.

Figure 8E:
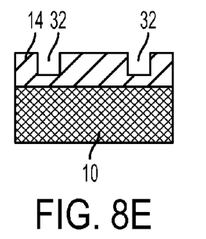

FIG. 8E shows a Group III-nitride film 14 patterned with trenches 32. The trenches 32 can be formed by reactive ion etching in a chlorine-containing gas mixture (e.g., $BCl_3$). While the sidewalls of these patterned features are shown as vertical, it should be noted that they may be slanted at a positive or negative angle.

Figure 8F:
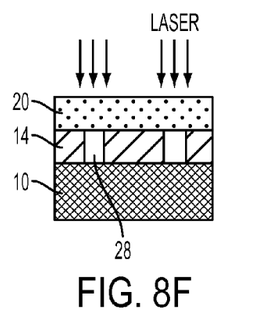
Figure 8G:
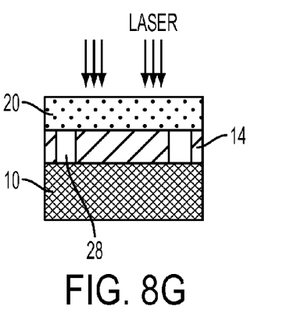

As shown in FIGS. 8F-8G, the patterns of laser irradiation may be aligned to overlap with the edges of these features (FIG. 8F) or to be offset from these features (FIG. 8G). It should be noted that a higher laser fluence may be required to initiate exfoliation in cases in which the laser irradiation is centered over a separation region filled with a non-absorbing material (e.g., the structure of FIG. 8F for the case of separation regions filled with $SiO_2$).

As will be discussed in more detail below, the Group III-nitride film 14 may also include Group III-nitride-based layers with one or more patterned layer features such as contacts on or embedded in the Group III-nitride-based layers, where these patterned features would typically and preferably be either transparent or outside any regions irradiated with the laser.

Figure 9A:
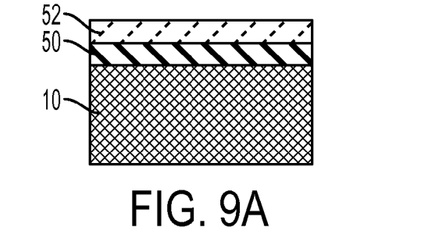
FIGS. 9A-9D show, in cross section view, examples of planar Group III-nitride-based layer stack structures that may be used to make LEDs with the transfer methods of the present disclosure.
Figure 9B:
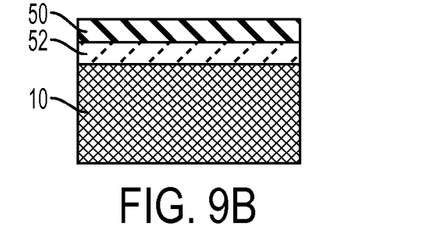
Figure 9C:
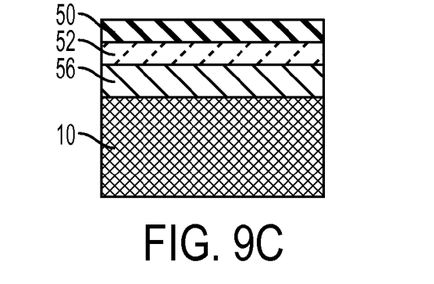
Figure 9D:
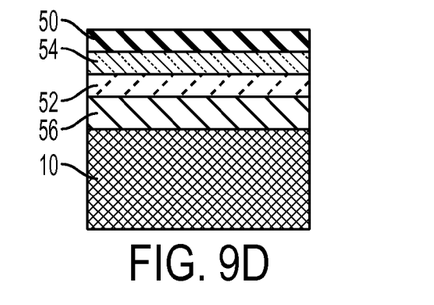

As mentioned above, Group III-nitride-based LEDs typically include a planar layer stack with a lower layer of one doping type (n-type or p-type) and an upper layer of the opposite doping type (p-type or n-type), along with spaced-apart n-type contacts to the n-type layer and p-type contacts to the p-type layer. FIGS. 9A-9D show illustrative examples of planar Group III-nitride-based layer stack structures that may be used to make LEDs with the transfer methods of this disclosure. In FIG. 9A, a p-type Group III-nitride layer 50 is disposed on a Si substrate 10 and an n-type Group III-nitride layer 52 is disposed on top of the p-type Group III-nitride layer 50. In FIG. 9B, the order of the layers is reversed, with an n-type Group III-nitride layer 52 on the bottom. FIG. 9C provides an example of the structure of FIG. 9B that includes an epitaxial buffer layer 56 (e.g., intrinsic Group III-nitride film). FIG. 9D shows a high performance LED structure that includes a multilayer quantum well (MQW) structure 54 between the n-type Group III-nitride layer 50 and the p-type Group III-nitride layer 52 of the structure of FIG. 9C. MQW structures 54 typically include multiple layers of a Group III-nitride with a thickness in the 2-10 nm range providing a barrier function interspersed with layers of a Group III-nitride with a thickness in the 2-10 nm range providing a well function. An example of a FIG. 9D LED structure is given in Rogers et al., cited previously. Grown on a Si(111) wafer, it includes (from the bottom up) a buffer layer, a Si-doped n-GaN layer with a thickness of 1.7 µm, 5 layers of multi-quantum well (MQW) comprising InGaN (3 nm)/Si-doped GaN(10 nm), and, finally a Mg-doped p-GaN layer with a thickness of 0.110 µm.

In the embodiments mentioned above, a p-type type or n-type dopant is preferably introduced during the MOCVD process. Alternatively, an undoped Group III-nitride film can be formed followed by introducing the appropriate conductivity-type dopant into the intrinsic Group III-nitride film by ion implantation, gas phase doping, or by outdiffusion the appropriate conducivity type dopant from a sacrificial layer that is subsequently removed from the structure after performing the outdiffusion.

In a third embodiment the above-described laser-initiated exfoliation methods are applied to the transfer of Group III-nitride films comprising fully or partially completed Group III-nitride-based devices such as LEDs, field effect transistors (FETs), and high electron mobility transistors (HEMTs). Specifically, Group III-nitride-based LED structures may be fabricated with a laser-initiated exfoliative transfer of the Group III-nitride film in a mode selected from one of the following, depending on the intended configuration of LED n-type and p-type contacts:

both n-type and p-type contacts are formed on the top side of GaN-based layer stack before the transfer process;

one type of the n-type and p-type contacts is formed on the top side of the GaN-based layer stack before the transfer process and the other type is formed after the transfer process; and both n-type and p-type contacts are formed after the transfer process.

Figure 10A:
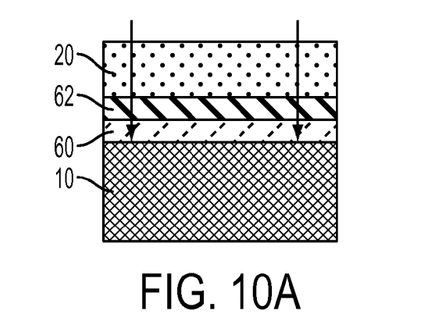
FIGS. 10A-10D show, in cross section view, examples of contacts that may be formed on structures used for Group III-nitride LED devices prior to implementing the transfer methods of the present disclosure.
Figure 10B:
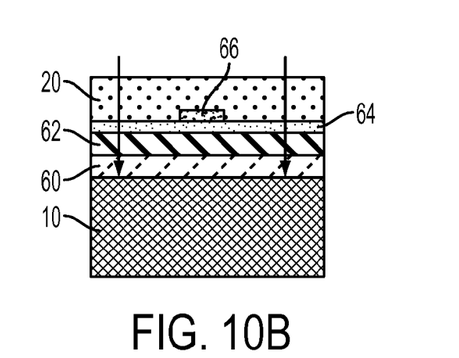
Figure 10C:
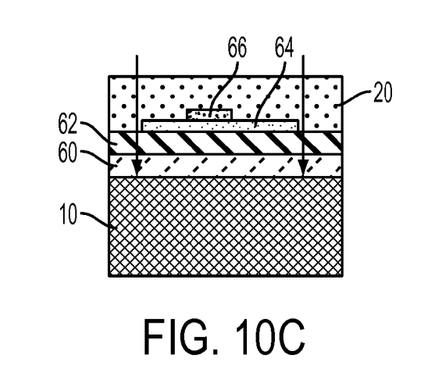

FIGS. 10A-10D show examples of contacts that may be formed on structures used for Group III-nitride LED devices prior to implementing the transfer methods of this disclosure. FIG. 10A shows laser irradiation being performed through a handle substrate 20 on a Group III-nitride layered structure comprising, from bottom to top, a Group III-nitride film 60 of a first doping type and a Group III-nitride layer 62 of a second doping type opposite to the first doping type, without any contacts. For simplicity, the examples of FIGS. 10A-10D are illustrated for the case of the structures of FIG. 9A-9B; however they are applicable as well to the structures of FIGS. 9C-9D which include MQWs and/or buffer layers. FIGS. 10B and 10C show laser irradiation being performed through a handle substrate 20 on a Group III-nitride layered structure that includes a two-tone contact comprising a large area transparent contact 64 and a smaller area opaque contact 66. The transparent contact 64 includes a transparent conductor such as, for example, indium tin oxide (e.g., 10 weight percent $SnO_2$ in $In_2O_3$). The transparent contact 58 can be formed by sputter deposition or evaporation, typically in an oxygen-containing ambient. The opaque contact 66 typically comprises a stack of two or more layers, with a lower layer selected for adhesion and low contact resistance and an upper layer selected for low resistance and environmental stability. Examples of opaque contact stacks include, but are not limited to, Ti(bottom)/Au(top), Cr(bottom)/Au(top), Ti(bottom)/Al/Au(top), where typical Ti, Cr, and Al thicknesses are in the range 10-100 nm (20-40 nm preferred), and Au thicknesses are in the range 100-500 nm (e.g., 300 nm). The opaque contact 66 can be formed by evaporation or sputter deposition. In the structure of FIG. 10B, the transparent region of the transparent contact 64 extends into the laser irradiation zone.

Figure 10D:
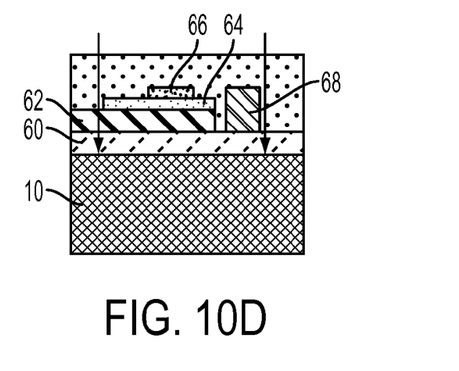

In the structure of FIG. 10C, the transparent contact 64 is between laser irradiation zones and not irradiated. FIG. 10D shows laser irradiation being performed through a handle substrate 20 on a Group III-nitride layered structure that includes both two-tone contact 64/66 to Group III-nitride layer 62 of second doping type and an opaque contact 68 to Group III-nitride layer 60 of first doping type. Opaque contact 68 is formed after a recess etch to expose a surface region of a Group III-nitride layer 60. The opaque contacts 66 and 68 may include the same or different materials, typically selected from the above examples of opaque contact stacks. It is noted that the recessed contact structure of FIG. 10D may be more prone to cracking than the structures of FIGS. 10A-10C for recess depths not thin compared to the total stack thickness. It should also be noted that the transparent two-tone contact of FIGS. 10C and 10D may be replaced with an opaque contact having the footprint of the transparent contact for the case of LED geometries in which it is desired that the LED output be reflected from (rather than transmitted through) the back contact.

FIGS. 11A-11D, 12A-12C, 13A-13C and 14A-14C illustrate the above-mentioned different ways in which laser-initiated exfoliative transfer of Group III-nitride-based LED layers might be integrated with n-type and p-type contacts using the transfer method of the present disclosure. While FIGS. 11A-11D, 12A-12C, 13A-13C and 14A-14C are shown for the case of a single LED device, it should be understood that the disclosure may be implemented for a plurality of LED devices, and that the devices in the plurality of LED devices may be singulated (i.e., separated from one or more adjacent devices) at any stage of processing. It should also be understood that roughened intermixing/reaction zones 106 are included primarily as markers to indicate the lateral location of the irradiated regions and that zones 106 would be removed if they were not either insulating enough or thin enough not to provide a conducting path between n-type and p-type GaN-based layers.

Figure 11A:
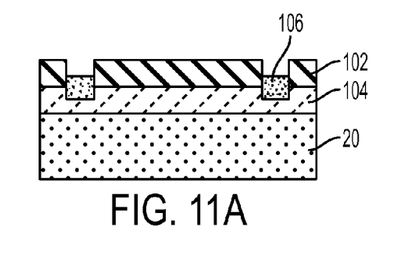
FIGS. 11A-11D show, in cross section view, an example of how the transfer methods of the present disclosure may be used to form an LED having both n-type and p-type contacts on the side of the Group III-nitride-based layer stack originally in contact with the growth substrate, wherein both contact types are formed after removal of the Group III-nitride-based layer from the growth substrate.
Figure 11B:
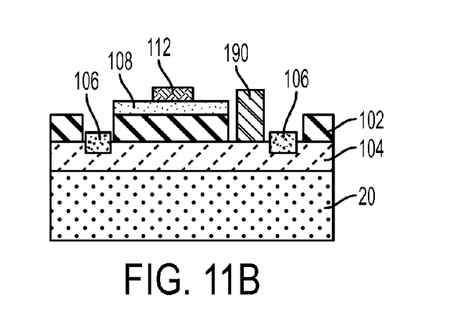
Figure 11C:
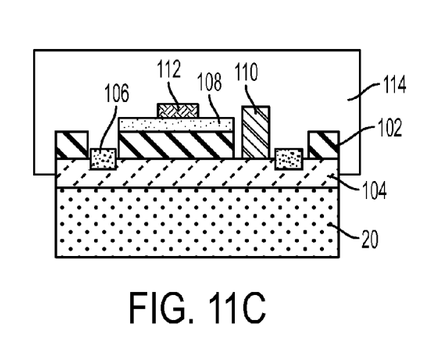
Figure 11D:
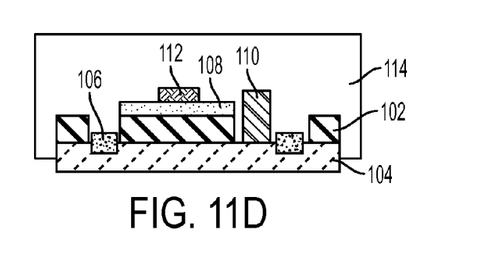

FIGS. 11A-11D show an example of how the transfer methods of this disclosure may be used to form an LED having both an n-type contact and a p-type contacts on the side of the Group III-nitride-based layer stack originally in contact with the growth substrate, wherein both contact types are formed after removal of the Group III-nitride-based layer from the growth substrate. For simplicity, this version is illustrated for a Group III-nitride-based stack having the structure of FIG. 9A, grown with the p-Group III-nitride layer directly on the Si substrate, though it may be employed in layer stacks such as those shown in FIGS. 9B-9D in which the doping types are reversed and/or include MQWs or buffer layers. The starting structure of FIG. 11A includes handle substrate 20, roughened intermixing/reaction zones 106 (which are the same as element 16' mentioned above), p-doped Group III-nitride film 102 that was originally in contact with the growth substrate, and n-type Group III-nitride film 104. The structure of FIG. 11B shows the structure of FIG. 11A after contact formation (with appropriate recess etches and two-tone electrode structure), where reference numeral 108 is a transparent conductor (similar to transparent contact 58), reference numeral 110 is an n-type contact (which can be an opaque metal layer) and reference numeral 112 is a p-type contact (which can be an opaque metal layer). After bonding to carrier package 114, typically including suitable interconnects and phosphors (FIG. 11C), handle substrate 20 is removed to produce the completed LED structure of FIG. 11D.

Figure 12A:
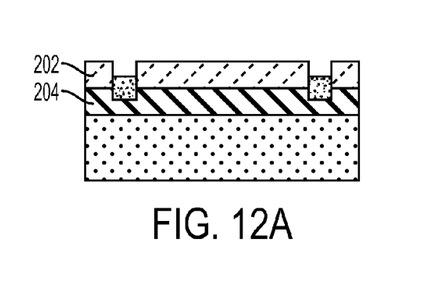
FIGS. 12A-12C show, in cross section view, an example of how the transfer methods of the present disclosure may be used to form an LED having n-type and p-type contacts on opposite sides of a Group III-nitride-based layer stack, wherein both contact types are formed after removal of the Group III-nitride-based layer from the growth substrate.
Figure 12B:
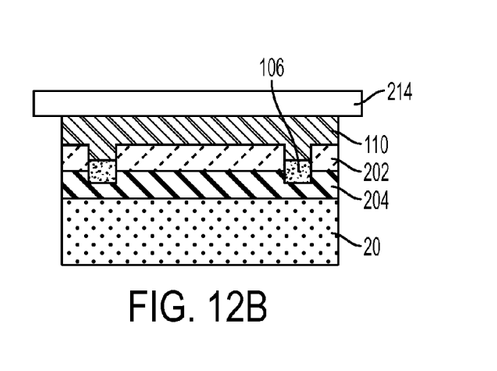
Figure 12C:
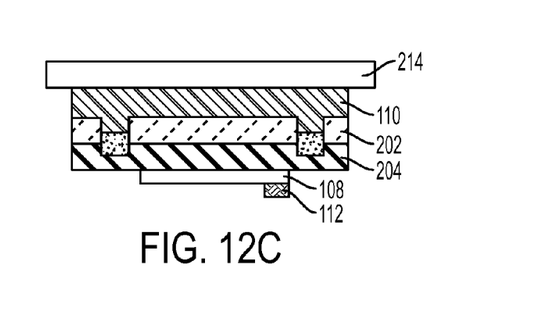

FIGS. 12A-12C show an example of how the transfer methods of this disclosure may be used to form an LED having n-type and p-type contacts on opposite sides of a Group III-nitride-based layer stack, wherein both contact types are formed after removal of the Group III-nitride-based layer from the growth substrate. For simplicity, this example is illustrated for a Group III-nitride-based stack having the structure of FIG. 9B, grown with the n-Group III-nitride layer directly on the Si substrate, though it may be employed in layer stacks such as those shown in FIGS. 9A and 9C-9D in which the doping types are reversed and/or include MQWs or buffer layers. The starting structure of FIG. 12A includes handle substrate 20, roughened intermixing reaction zones 106, n-doped Group III-nitride film 202 that was originally in contact with the growth substrate, and p-type Group III-nitride film 204. The structure of FIG. 12B shows the structure of FIG. 12A after formation of reflective back contact layer 110 and mounting on a temporary or permanent substrate 214. Substrate 214 may be flexible or rigid and is typically conductive. After removal of handle substrate 20 (typically a tape) and formation of a p-type contact 108/112 (comprising transparent conductor 108 and localized opaque conductor 112), the LED structure of FIG. 12C is then packaged with suitable interconnects and phosphors (not shown).

Figure 13A:
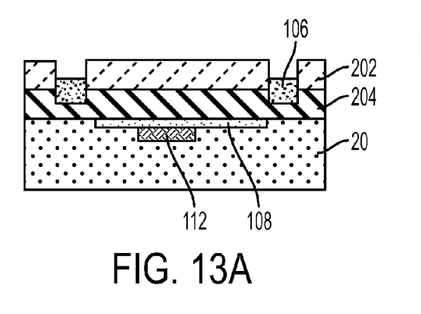
FIGS. 13A-13C show, in cross section view, an example of how the transfer methods of the present disclosure may be used to form an LED having n-type and p-type contacts on opposite sides of a Group III-nitride-based layer stack, wherein a contact of one type is formed on the Group III-nitride-based layer prior to transfer from the growth substrate and the contact of the opposite type is formed on the Group III-nitride-based layer stack after transfer from the growth substrate.
Figure 13B:
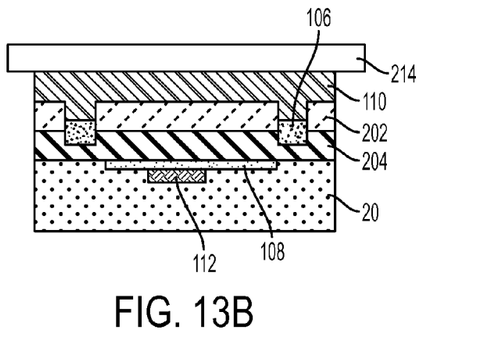
Figure 13C:
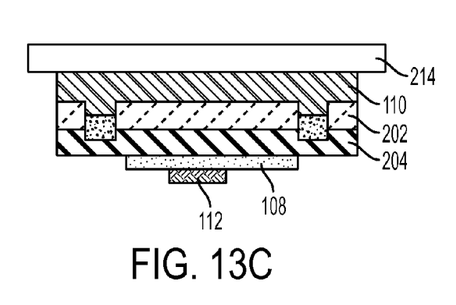

FIGS. 13A-13C show an example of how the transfer methods of this disclosure may be used to form an LED having n-type and p-type contacts on opposite sides of a Group III-nitride-based layer stack, wherein a contact of one type is formed on the Group III-nitride-based layer prior to transfer from the growth substrate and the contact of the opposite type is formed on the Group III-nitride-based layer stack after transfer from the growth substrate. For simplicity, this example is illustrated for a Group III-nitride-based stack having the structure of FIG. 9B, grown with the n-Group III-nitride layer directly on the Si substrate, though it may be employed in layer stacks such as those shown in FIGS. 9A and 9C-9D in which the doping types are reversed and/or include MQWs or buffer layers. The starting structure of FIG. 13A includes handle substrate 20, roughened intermixing reaction zones 106, n-doped Group III-nitride layer 202 that was originally in contact with the growth substrate, p-doped Group III-nitride layer 204, and p-type contact 108/112 (comprising transparent conductor 108 and localized opaque conductor 112) formed on p-type Group III-nitride film 204 prior to introduction of handle substrate 20. FIG. 13B shows the structure of FIG. 13A after formation of reflective back contact layer 110 and mounting on a temporary or permanent substrate 214. Substrate 214 may be flexible or rigid and is typically conductive. After removal of the handle substrate 20 to expose p-type contact 108/112 (FIG. 13C), the structure is then packaged with suitable interconnects and phosphors (not shown).

Figure 14A:
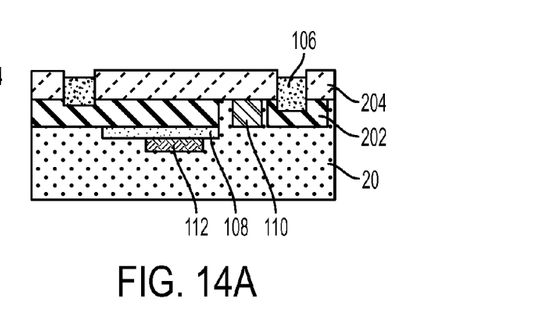
FIGS. 14A-14C show, in cross section view, an example of how the transfer methods of this invention may be used to form an LED having n-type and p-type contacts on the same side of a Group III-nitride-based layer stack, wherein both type contacts are formed prior to the removal of the Group III-nitride-based layer from the growth substrate.
Figure 14B:
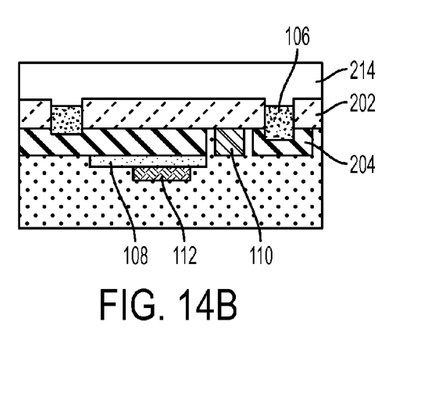
Figure 14C:
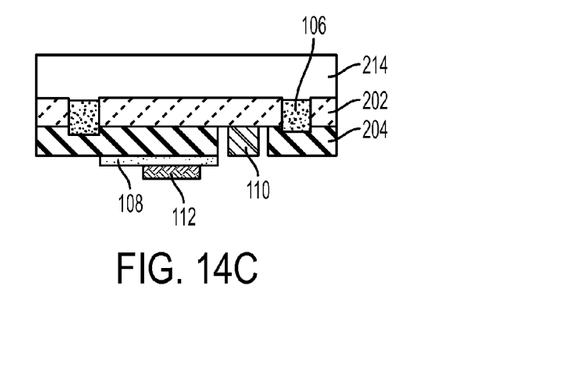

FIGS. 14A-14C show an example of how the transfer methods of this disclosure may be used to form an LED having n-type and p-type contacts on the same side of a Group III-nitride-based layer stack, wherein both type contacts are formed prior to the removal of the Group III-nitride-based layer from the growth substrate. The steps for this version requires a minimum of post-peel processing; the remaining steps include mounting on a carrier which may be rigid or, reflective or transparent; removing the tape (completely, or just in selected areas) to expose contacts, and packaging as desired (e.g., with suitable interconnects and phosphors. For simplicity, this example is illustrated for a Group III-nitride-based stack having the structure of FIG. 9B, grown with the n-Group III-nitride layer directly on the Si substrate, though it may be employed in layer stacks such as those shown in FIGS. 9A and 9C-9D in which the doping types are reversed and/or include MQWs or buffer layers. The starting structure of FIG. 14A includes handle substrate 20, roughened intermixing reaction zones 106, n-doped Group III-nitride film 202 that was originally in contact with the growth substrate, and p-doped Group III-nitride film 204. P-type contacts 108/112 (on p-type Group III-nitride layer 204) and n-type contacts 110 (on n-type Group III-nitride layer 202) were formed prior to introduction of handle substrate 20, with n-type contact 110 formed after exposing a buried portion of n-doped Group-III nitride 202 with a recess etch. FIG. 14B shows the structure of FIG. 14A after mounting on a temporary or permanent substrate 214. After removal of handle substrate 20 (FIG. 14C), the structure is then packaged with suitable interconnects and phosphors (not shown).

In another version of this transfer disclosure, the Si/GaN/tape assembly would be irradiated along a single line near the assembly edge just to start the GaN exfoliation. With careful peeling, it is speculated that continued delamination will occur at the Si/GaN interface rather than at the GaN/tape interface, thus making it possible to use tape peeling to remove GaN from regions far from the initial laser-induced exfoliation region and perhaps to peel off GaN areas as large as the entire Si substrate.

It is expected that the transfer version of this disclosure may be extended to other transparent materials grown on absorbing substrates. For example the disclosure might be useful for transferring (i) other transparent nitrides grown on Si or (ii) SiC and/or polycrystalline diamond grown on Si. However, such transfers may be difficult on materials such as SiC that lack GaN's ability to release a high vapor pressure gas at a relatively low decomposition temperature.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A pulsed laser-initiated exfoliation method for patterning a Group III-nitride film on a substrate, said method comprising:
    providing a Group III-nitride film on a growth substrate, wherein a growth substrate/Group III-nitride film interface is present between the Group III-nitride film and the growth substrate;
    forming a sacrificial protection layer on the Group III-nitride film prior to laser irradiation;
    selecting a laser that provides radiation at a wavelength at which the Group III-nitride film is transparent and the growth substrate is absorbing;
    irradiating the interface with pulsed laser radiation from the Group III-nitride film side of the growth substrate/Group III-nitride film interface to exfoliate a region of the Group III-nitride from the growth substrate; and
    removing said sacrificial layer after said laser irradiation.

2. The method of claim 1, wherein said sacrificial protection layer is a blanket layer covering an entirety of the Group III-nitride film.

3. The method of claim 1, wherein said sacrificial protection layer is a patterned layer disposed at least over the Group III-nitride film in areas not being irradiated and functioning to protect non-irradiated Group III-nitride film areas from redeposition of laser-generated particulates.

4. The method of claim 1, wherein said Group III-nitride film is formed by metalorganic chemical vapor deposition.

5. The method of claim 1, wherein said Group III-nitride film includes at least nitrogen and gallium, and said growth substrate is a (111) Si substrate.

6. The method of claim 1, wherein said irradiating is applied in a pattern.

7. The method of claim 6, wherein said irradiating comprises using a laser with an output at a wavelength of 532 nm in 20 ns pulse widths, pulse energies of 12 to 30 µJ, and spot diameters of 30-50 µm.

8. The method of claim 6, wherein said irradiating comprises using a laser with an output at a wavelength of 1064 nm in 30 ns pulse widths, pulses energies of 130 to 180 µJ, and spot diameters 30-50 µm.

9. The method of claim 1, wherein said Group III-nitride film is in epitaxial alignment with said growth substrate.

* * * * *